United States Patent
Izuhara

(10) Patent No.: US 10,690,753 B2
(45) Date of Patent: Jun. 23, 2020

(54) IMAGING APPARATUS AND DISTANCE MEASUREMENT SYSTEM

(71) Applicant: Sony Corporation, Tokyo (JP)

(72) Inventor: Kunihiko Izuhara, Kanagawa (JP)

(73) Assignee: Sony Corporation, Tokyo (JP)

( * ) Notice: Subject to any disclaimer, the term of this patent is extended or adjusted under 35 U.S.C. 154(b) by 86 days.

(21) Appl. No.: 15/747,229

(22) PCT Filed: Feb. 24, 2017

(86) PCT No.: PCT/JP2017/007216
§ 371 (c)(1),
(2) Date: Jan. 24, 2018

(87) PCT Pub. No.: WO2017/150391
PCT Pub. Date: Sep. 8, 2017

(65) Prior Publication Data
US 2018/0372846 A1  Dec. 27, 2018

Related U.S. Application Data

(60) Provisional application No. 62/303,506, filed on Mar. 4, 2016.

(51) Int. Cl.
*G01S 7/48* (2006.01)
*G01S 7/481* (2006.01)
(Continued)

(52) U.S. Cl.
CPC .......... *G01S 7/4816* (2013.01); *G01S 7/4914* (2013.01); *G01S 17/89* (2013.01); *H01L 27/144* (2013.01);
(Continued)

(58) Field of Classification Search
USPC ........................................................ 356/5.01
See application file for complete search history.

(56) References Cited

U.S. PATENT DOCUMENTS 6,987,268 B2 * 1/2006 Kuijk .................. H01L 31/0352
250/370.01
8,294,882 B2 * 10/2012 Van Der Tempel .........................
G01S 7/4913
356/5.01
(Continued)

FOREIGN PATENT DOCUMENTS

JP  2011-086904 A  4/2011
JP  2015-510259 A  4/2015
(Continued)

OTHER PUBLICATIONS

Riemer Grootjans, Ward van der Tempel, Daniël Van Nieuwenhove, and Maarten Kuijk "Analysis of non-ideal behavior of CAPD based time-of-flight pixels", Proc. SPIE 7000, Optical and Digital Image Processing. (Year: 2008).*

(Continued)

*Primary Examiner* — James R Hulka
(74) *Attorney, Agent, or Firm* — Wolf, Greenfield & Sacks, P.C.

(57) ABSTRACT

[Object] To uniformly produce electric fields when performing thinning processing of generating electric fields in only some of a plurality of pixels.
[Solution] There is provided an imaging apparatus including: a pair of electric field application electrodes and a pair of electric charge extraction electrodes provided to each of a plurality of pixels; and a voltage application section configured to apply voltage between a first electrode that is one of the pair of electric field application electrodes of a first pixel and a second electrode that is one of the pair of electric field application electrodes of a second pixel when pixel combination is performed, and produce an electric field across the first pixel and the second pixel.

7 Claims, 14 Drawing Sheets

(51) Int. Cl.
*H01L 27/144* (2006.01)
*G01S 17/89* (2020.01)
*H01L 27/146* (2006.01)
*G01S 7/4914* (2020.01)
*G01S 17/931* (2020.01)

(52) U.S. Cl.
CPC ...... *H01L 27/146* (2013.01); *H01L 27/14605* (2013.01); *G01S 17/931* (2020.01)

(56) References Cited

U.S. PATENT DOCUMENTS

| | | | | |
|---|---|---|---|---|
| 8,432,502 | B2* | 4/2013 | Yamazaki | G02F 1/1368 349/43 |
| 8,659,108 | B2* | 2/2014 | Van Niewenhove | G01J 3/00 257/440 |
| 9,214,492 | B2* | 12/2015 | Van Der Tempel | H01L 27/14645 |
| 9,507,197 | B2* | 11/2016 | Uchida | G02B 6/0041 |
| 2005/0051730 | A1 | 3/2005 | Kuijk et al. | |
| 2011/0063614 | A1 | 3/2011 | Niewenhove et al. | |
| 2011/0134350 | A1* | 6/2011 | Yamazaki | G02F 1/1368 349/43 |
| 2011/0242146 | A1* | 10/2011 | Uchida | G02B 6/0041 345/690 |
| 2011/0255071 | A1 | 10/2011 | Van Der Tempel et al. | |
| 2014/0267613 | A1* | 9/2014 | Cohen | G01S 7/4863 348/46 |
| 2015/0001664 | A1 | 1/2015 | Van Der Tempel et al. | |
| 2016/0099429 | A1* | 4/2016 | Bruder | G01S 17/06 348/374 |
| 2017/0171485 | A1* | 6/2017 | Kawahito | H01L 27/14643 |
| 2017/0237926 | A1* | 8/2017 | Bruder | G01S 17/86 348/294 |

FOREIGN PATENT DOCUMENTS

| | | |
|---|---|---|
| WO | WO 2015/104307 A1 | 7/2015 |
| WO | WO 2015/197685 A1 | 12/2015 |

OTHER PUBLICATIONS

Van der Tempel, Ward, et al. "Lock-in Pixel Using a Current-Assisted Photonic Demodulator Implemented in 0.6 μm Standard Complemetary Metal-Oxide-Semiconductor." Japanese journal of applied physics 46.4S (2007): 2377. (Year: 2007).*

Van der Tempel, Ward, et al. "A 1k-pixel 3D CMOS sensor." Sensors, 2008 IEEE. IEEE, 2008. (Year: 2008).*

International Search Report and English translation thereof dated May 9, 2017 in connection with International Application No. PCT/JP2017/007216.

* cited by examiner

IMAGING APPARATUS AND DISTANCE MEASUREMENT SYSTEM

CROSS-REFERENCE TO RELATED APPLICATIONS

This application claims the benefit under 35 U.S.C. § 371 as a U.S. National Stage Entry of International Application No. PCT/JP2017/007216, filed in the Japanese Patent Office as a Receiving Office on Feb. 24, 2017, which claims priority to U.S. Patent Application No. 62/303,506, filed Mar. 4, 2016, each of which is hereby incorporated by reference in its entirety.

TECHNICAL FIELD

The present disclosure relates to an imaging apparatus and a distance measurement system.

BACKGROUND ART

In recent years, time of flight (ToF) sensors or the like have been used as sensors that measure the distance to targets. For example, Patent Literature 1 below describes a ToF sensor that uses a pair of electrodes to generate an electric field.

CITATION LIST

Patent Literature
 Patent Literature 1: JP 2011-86904A

DISCLOSURE OF INVENTION

Technical Problem

However, the technology described in Patent Literature 1 has the problem that the use of a pair of electrodes to generate an electric field in each of a plurality of pixels included in the ToF sensor increases electric power consumption. In contrast, when thinning processing of generating electric fields in only some of the plurality of pixels is performed, the electric fields are biased. It is difficult to uniformly generate electric fields in pixel regions.

It has been then required to uniformly produce electric fields when performing thinning processing of generating electric fields in only some of a plurality of pixels.
Solution to Problem According to the present disclosure, there is provided an imaging apparatus including: a pair of electric field application electrodes and a pair of electric charge extraction electrodes provided to each of a plurality of pixels; and a voltage application section configured to apply voltage between a first electrode that is one of the pair of electric field application electrodes of a first pixel and a second electrode that is one of the pair of electric field application electrodes of a second pixel when pixel combination is performed, and produce an electric field across the first pixel and the second pixel.

In addition, according to the present disclosure, there is provided a distance measurement system including: a floodlight apparatus configured to floodlight a target with light; an imaging apparatus configured to receive light reflected by the target; and a control apparatus configured to control the floodlight apparatus and the imaging apparatus. The imaging apparatus includes a pair of electric field application electrodes and a pair of electric charge extraction electrodes provided to each of a plurality of pixels, and a voltage application section configured to apply voltage between a first electrode that is one of the pair of electric field application electrodes of a first pixel and a second electrode that is one of the pair of electric field application electrodes of a second pixel when pixel combination is performed, and produce an electric field across the first pixel and the second pixel.

Advantageous Effects of Invention

According to the present disclosure, it is possible to uniformly produce electric fields when performing thinning processing of generating electric fields in only some of a plurality of pixels.

Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
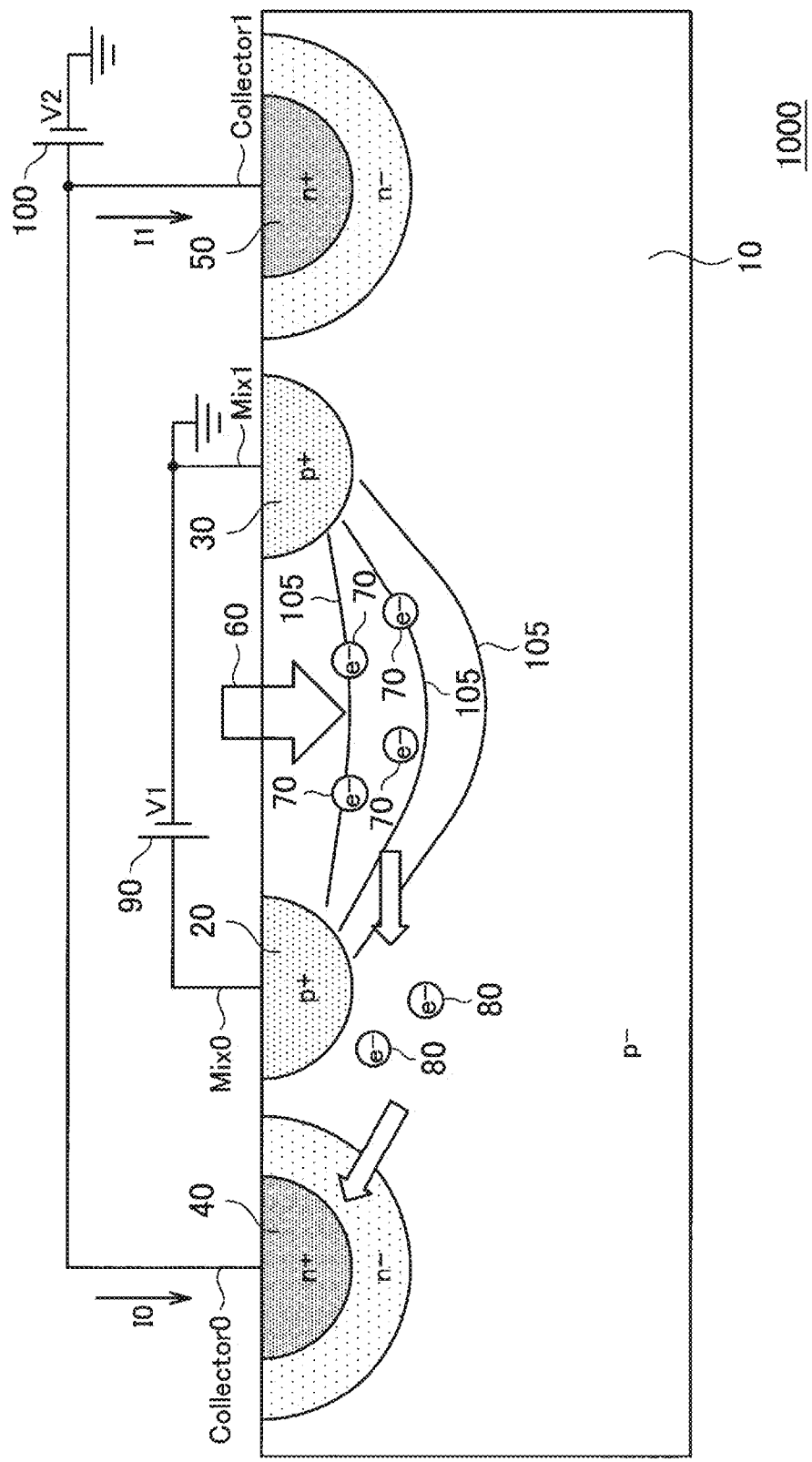
FIG. 1 is a schematic cross-sectional view illustrating a ToF sensor that is an imaging apparatus 1000 according to an embodiment of the present disclosure, and has a CAPD structure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description will be made in the following order.
1. Prerequisite Technology
2. Example of Pixel Combination according to Present Embodiment
3. Regarding Driving of Pixel
4. Configuration Example of Distance Measurement System according to Present Embodiment
5. Application Examples 1. Prerequisite Technology In the case where pixel combination is performed in a ToF sensor having a CAPD structure, voltage is applied to a pair of electric field application electrodes in a plurality of pixel regions and electric charges are extracted from a pair of electric charge extraction electrodes. This makes it possible to acquire the electric current value corresponding to an electric charge excited by light. At this time, performing pixel combination decreases electric field application electrodes to which voltage is applied, so that it is possible to reduce electric power consumption.

FIG. 1 is a schematic cross-sectional view illustrating a ToF sensor 1000 that is an imaging apparatus according to an embodiment of the present disclosure, and has a CAPD structure. The base layer of the ToF sensor 1000 includes an epitaxial layer 10 of silicon. As illustrated in FIG. 1, when light 60 is incident on the ToF sensor 1000, electrons 70 are excited. A power supply 90 produces electric fields 105 for moving the electrons 70 that are excited by the light 60. In addition, the power supply 100 generates voltage for extracting the electric charges of the excited electrons. Among the two electrodes at both ends of the power supply 90, an electrode Mix0 is connected to a p-type diffusion layer 20, and an electrode Mix1 is connected to a p-type diffusion layer 30. In addition, among the two electrodes at both ends of the power supply 100, an electrode Collector0 is connected to an n-type diffusion layer 40, and an electrode Collector1 is connected to an n-type diffusion layer 50.

The power supply 90 applies voltage V1 to generate the electric fields 105 in the epitaxial layer 10, and the electrons 70 are moved close to the electrode Collector0 and the electrode Mix0 by the electric field 105. Electrons 80 moved close to the electrode Collector0 and the electrode Mix0 are pulled into the n-type diffusion layer 40, to which the power supply 100 applies voltage V2, and an electric current I0 is generated. Alternating the polarity of the power supply 90 in frequency f (Hz) makes it possible to attain a demodulation effect necessary to measure distance. When the polarity of the power supply 90 is reversed from the state of FIG. 1, the electrons 70 are moved close to the electrode Collector0 and the electrode Mix1 by the electric fields 105. Electrons moved close to the electrode Collector1 and the electrode Mix1 are pulled into the n-type diffusion layer 50, to which the power supply 100 applies voltage V2, and an electric current I1 is generated.

Figure 2:
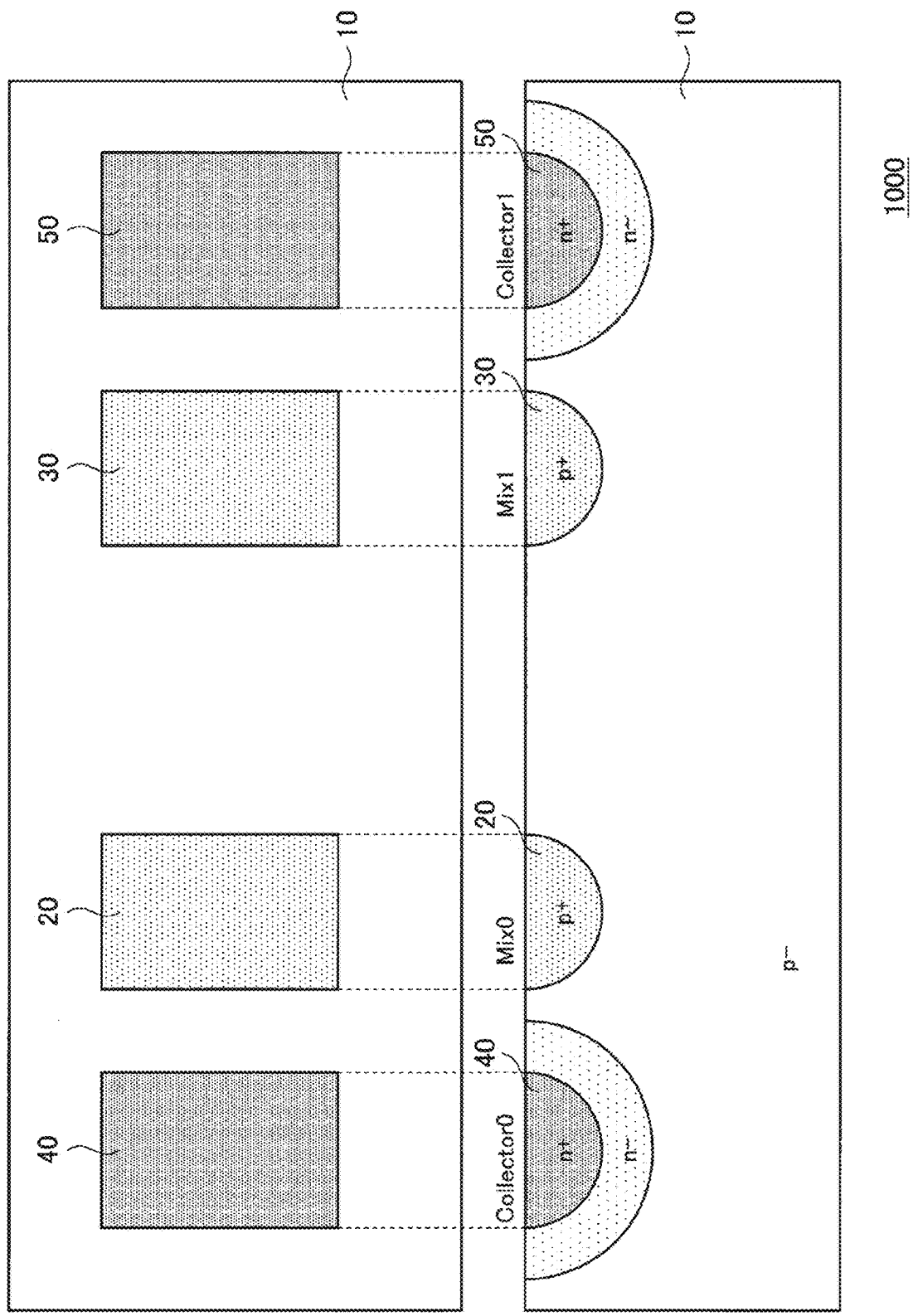
FIG. 2 is a schematic diagram illustrating both the schematic cross-sectional view illustrated in FIG. 1 and a top plan view of the ToF sensor.

FIG. 2 is a schematic diagram illustrating both the schematic cross-sectional view illustrated in FIG. 1 and a top plan view of the ToF sensor 1000. As illustrated in FIG. 2, as an example, the p-type diffusion layer 20, the p-type diffusion layer 30, the n-type diffusion layer 40, and the n-type diffusion layer 50 all have rectangular plane shapes.

The technology of collectively treating a plurality of adjacent pixels in the pixel array of an image sensor to virtually increase the light reception area per pixel and increase the light reception sensitivity is referred to as pixel combination or pixel binning. In the distance measurement system that uses the ToF sensor 1000, performing pixel combination allows for increase in the light reception sensitivity, and makes it possible to improve the distance measurement accuracy. Specifically, performing pixel combination enlarges the regions to which the power supply 90 applies the voltage V1, and increases the area in which the electrons 70 that are excited by the light 60 are present. Accordingly, it is possible to increase the light reception sensitivity.

Thus, in the system that uses the ToF sensor 1000, a target is floodlit with light such as infrared light, and the light is received from the target to measure the distance to the target with the phase difference. At this time, performing pixel combination makes it possible to efficiently collect more electric charges.

Figure 3:
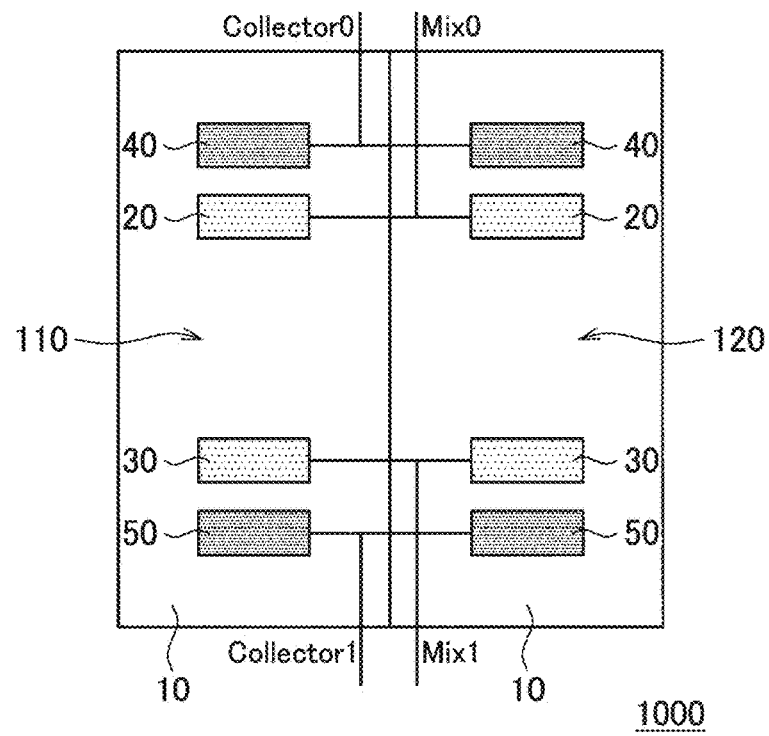
FIG. 3 is a plan view illustrating an example in which two pixels are combined in a case where pixel combination is performed with CAPD pixels.

FIG. 3 is a plan view illustrating an example in which two pixels are combined in the case where pixel combination is performed with CAPD pixels. In FIG. 3, a pixel 110 and a pixel 120 adjacent to the right thereof are connected to the respective electrodes, thereby making it possible to virtually configure a large pixel. In more detail, the electrode Mix0 is connected to the respective p-type diffusion layers 20 of the pixel 110 and the pixel 120, and the electrode Mix1 is connected to the respective p-type diffusion layers 30 of the pixel 110 and the pixel 120. In addition, the electrode Collector0 is connected to the respective n-type diffusion layers 40 of the pixel 110 and the pixel 120, and the electrode Collector1 is connected to the respective n-type diffusion layers 50 of the pixel 110 and the pixel 120. According to the configuration illustrated in FIG. 3, the p-type diffusion layers 20, the p-type diffusion layers 30, the n-type diffusion layers 40, and the n-type diffusion layers 50 are coupled in the pixel 110 and the pixel 120, so that it is possible to combine the two pixels.

Figure 4:
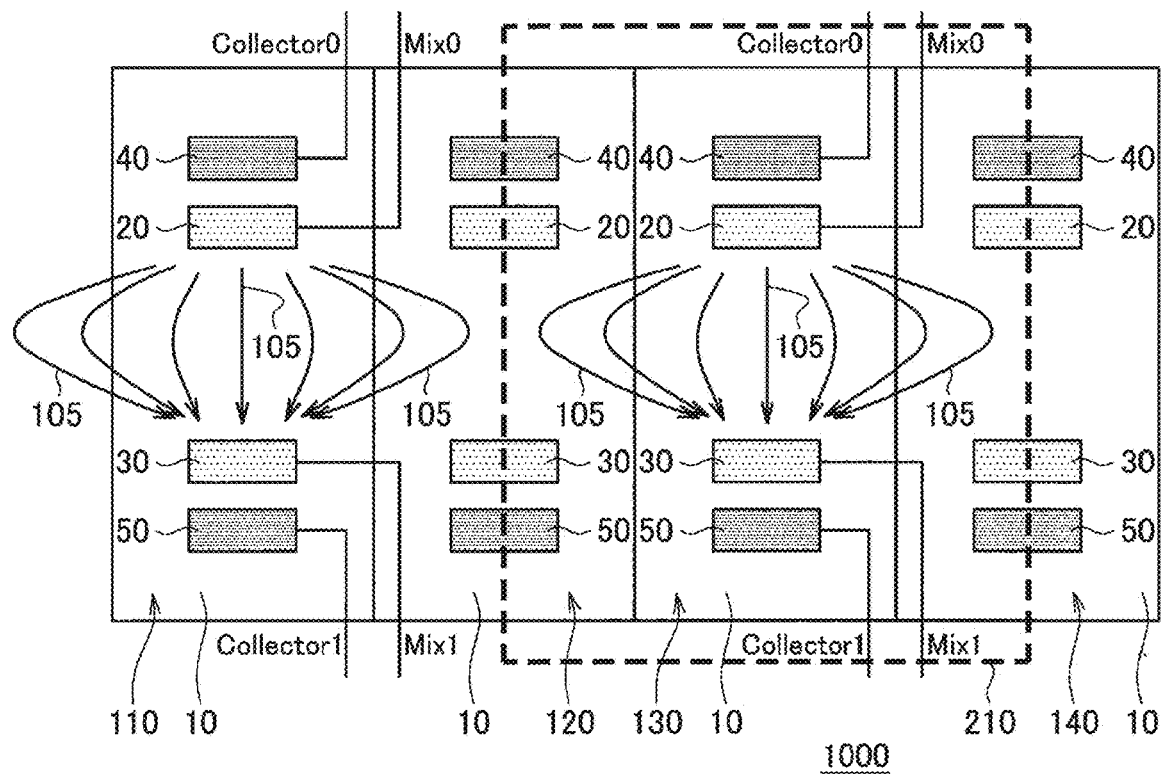
FIG. 4 is a plan view illustrating an example in which voltage is applied to a p-type diffusion layer of one of two adjacent pixels.

In addition, according to the principle of CAPD, electrons excited by light are moved by electric fields. Therefore, different from FIG. 3, a technique is used. In addition, voltage is applied to only one of the adjacent pixels, thereby making possible to combine the pixels. FIG. 4 is a plan view illustrating an example in which, in the pixel 110 and the pixel 120, which are adjacent to each other, voltage is applied to the p-type diffusion layers 20 and 30 of the pixel 110, and, in a pixel 130 and a pixel 140, which are adjacent to each other, voltage is applied to the p-type diffusion layers 20 and 30 of the pixel 130.

As illustrated in FIG. 4, applying voltage to only one of the pixels makes it possible to enlarge the pixel. In this case, when focus is placed on the pixel 130, in the pixel 120 and the pixel 140, which are adjacent to each other, no voltage is applied to the p-type diffusion layers 20 or p-type diffusion 30. However, it is possible to collect the electric charges within the range of an equivalent pixel region 210 from the p-type diffusion layer 20 and the p-type diffusion layer 30 of the pixel 130 by the electric fields 105 generated by the applied voltage. If the vertical and horizontal pitches of pixels are configured like FIG. 3, the equivalent pixel region 210 has the same area as the area of the two of the pixel 110 and the pixel 120, which are combined according to the pixel combination described in FIG. 3. In FIG. 4, voltage just has to be applied to the electrodes Mix0 and Mix1 of one pixel 130 to produce electric fields in the equivalent pixel region 210 corresponding to two pixels. Meanwhile, in FIG. 3, more electric power is consumed to apply voltage to the electrodes Mix0 and Mix1 of the two pixels 110 and 120 to produce electric fields in the region corresponding to two pixels than in FIG. 4. Thus, according to the configuration illustrated in FIG. 4, the paths of the electric currents of the electrodes Mix0 and Mix1 that produce electric fields to collect the electric charges of the same pixel region as that of FIG. 3 decrease from two to one. Accordingly, it is possible to make the electric power consumption less than the pixel combination according to FIG. 3 does.

In FIG. 4, regarding the pixel 120 and the pixel 140, in which no voltage is applied to the p-type diffusion layers 20 and 30, voltage does not have to be applied to the n-type diffusion layers 40 and 50. Meanwhile, the n-type diffusion layers 40 and 50 of the pixel 120 and the pixel 140 may be provided with any electric potential. For example, when the n-type diffusion layers 40 and 50 of the pixel 120 and the pixel 140 are provided with the same electric potential as that of the epitaxial layers 10, it is easier for the excited electrons 70 to gather in the n-type diffusion layers 40 and 50 of the pixels 110 and 130 through the electric fields 105. Note that, in FIG. 4, the description has been made with vertically long pixels used as an example, but square pixels or horizontally long pixels may also be used.

Meanwhile, in the case where voltage is applied to the p-type diffusion layers 20 and the p-type diffusion layers 30 of all the pixel 110, pixel 120, pixel 130, and pixel 140 without performing pixel combination, electric power consumption increases, but it is possible to increase resolution. Thus, it is desirable to drive all the pixels in the case where resolution is necessary, and perform pixel combination in the case where light reception sensitivity is increased. It is possible to decide whether to drive all the pixels or perform pixel combination, in accordance with the usage environment of the ToF sensor 1000, or the condition, nature, or the like of a target that is to be floodlit with light.

2. Example of Pixel Combination according to Present Embodiment

Figure 5:
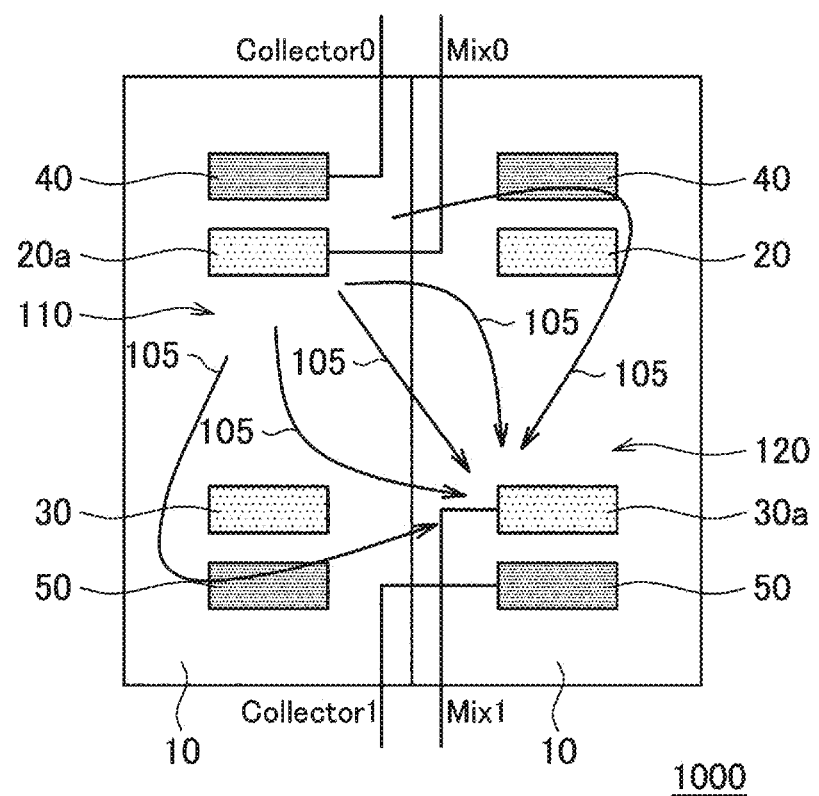
FIG. 5 is a plan view illustrating pixel combination according to an embodiment of the present disclosure.

FIG. 5 is a plan view illustrating pixel combination according to the present embodiment. In FIG. 5, in the pixel 110 and the pixel 120, which are combined, voltage is applied to the two of the p-type diffusion layers 20a and the p-type diffusion layers 30a, which are diagonally positioned in the pixel regions and the most distant, and the electric fields 105 are produced in an oblique direction of the arrangement direction of the pixels to accumulate the electric charges. In this way, a long distance is secured between the pair of the p-type diffusion layer 20a and a p-type diffusion layer 30b and the electric fields 105 are provided within a wide range, so that it is possible to efficiently accumulate electric charges. The pair of the p-type diffusion layer 20a and the p-type diffusion layer 30a do not have to be positioned diagonally, and may be any pair of p-type diffusion layers.

In the configuration illustrated in FIG. 4, the voltage V1 is applied to the p-type diffusion layers 20 and 30 of one (pixel 110 and pixel 130) of two adjacent pixels. Accordingly, in the pixel 120 and pixel 140, the p-type diffusion layers 20 and 30 of which the voltage V1 is not applied to, the electric fields 105 are not produced, but the electric fields 105 are biased in the pixel regions. It is not possible to uniform the electric fields 105 in the pixel regions. Meanwhile, in the present embodiment illustrated in FIG. 5, a long distance is secured between the p-type diffusion layer 20a and the p-type diffusion layer 30a and it is possible to provide the electric fields 105 within a wide range, so that resistance values increase to make it possible to decrease the electric power consumption. Further, it is possible to uniformly produce the electric fields 105 in the pixel regions, so that it is possible to efficiently collect electrons excited in the regions.

Figure 6A:
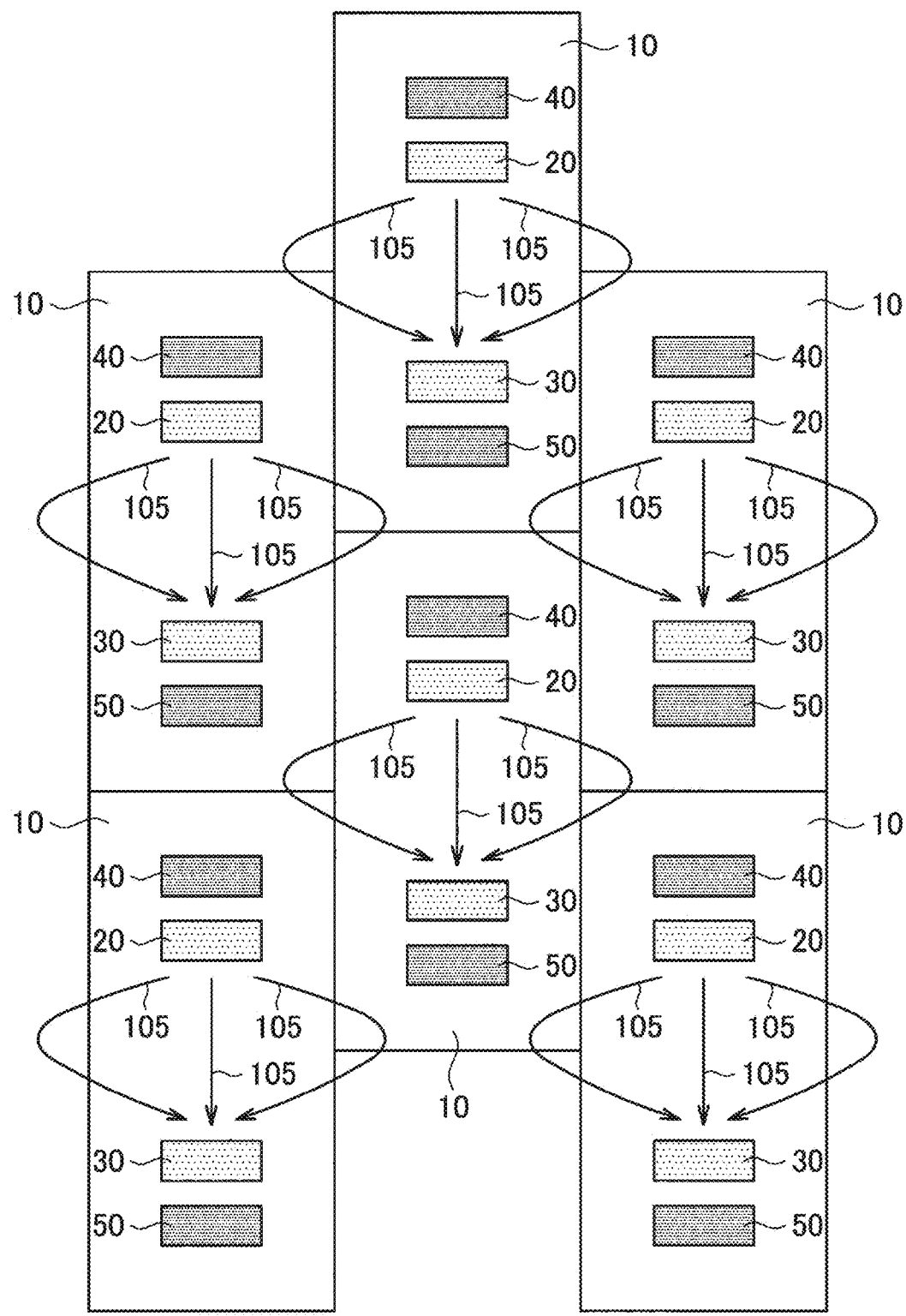
FIG. 6A is a plan view illustrating a variation of arrangement of pixels.
Figure 6B:
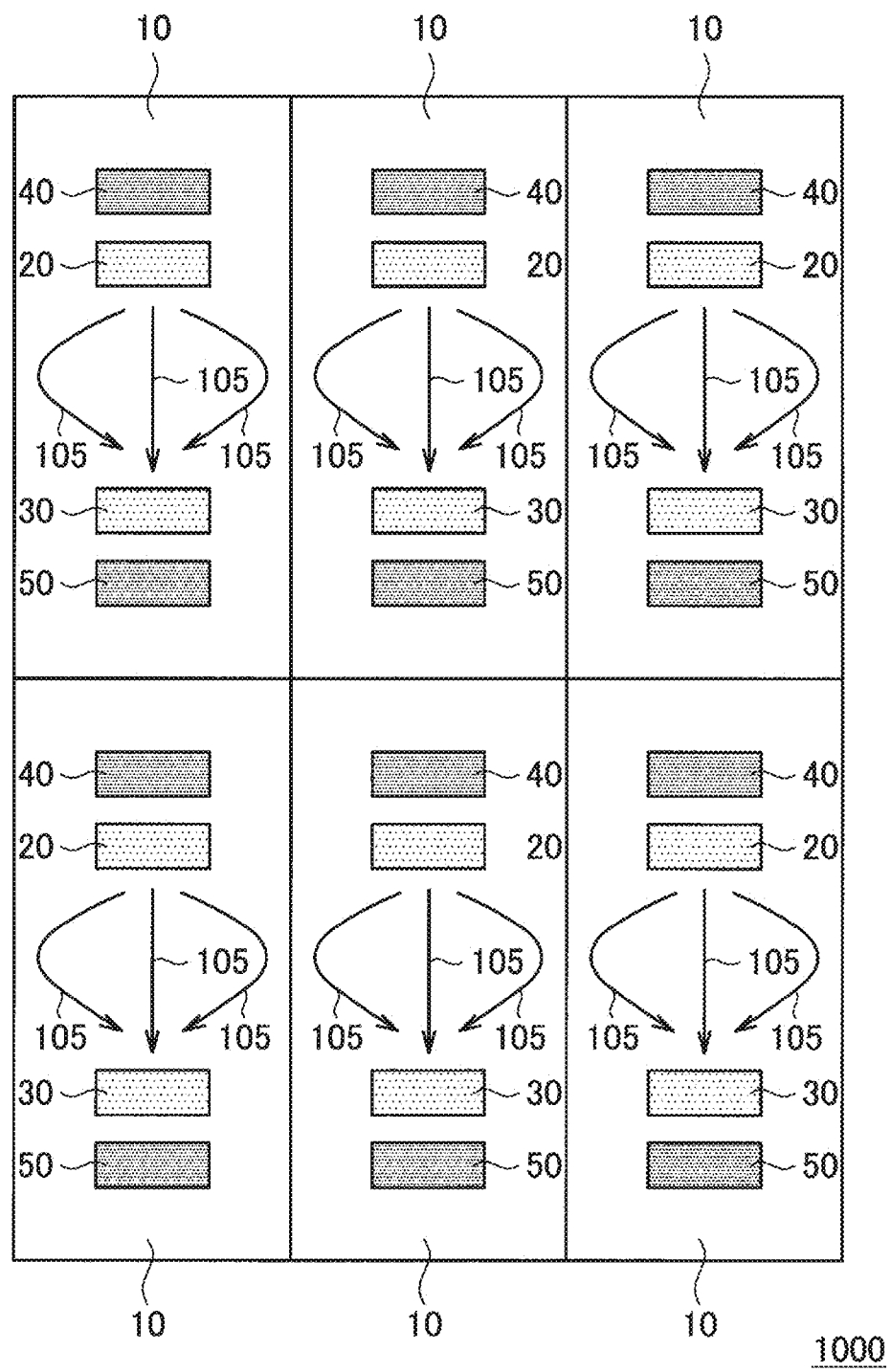
FIG. 6B is a plan view illustrating a variation of the arrangement of pixels.
Figure 6C:
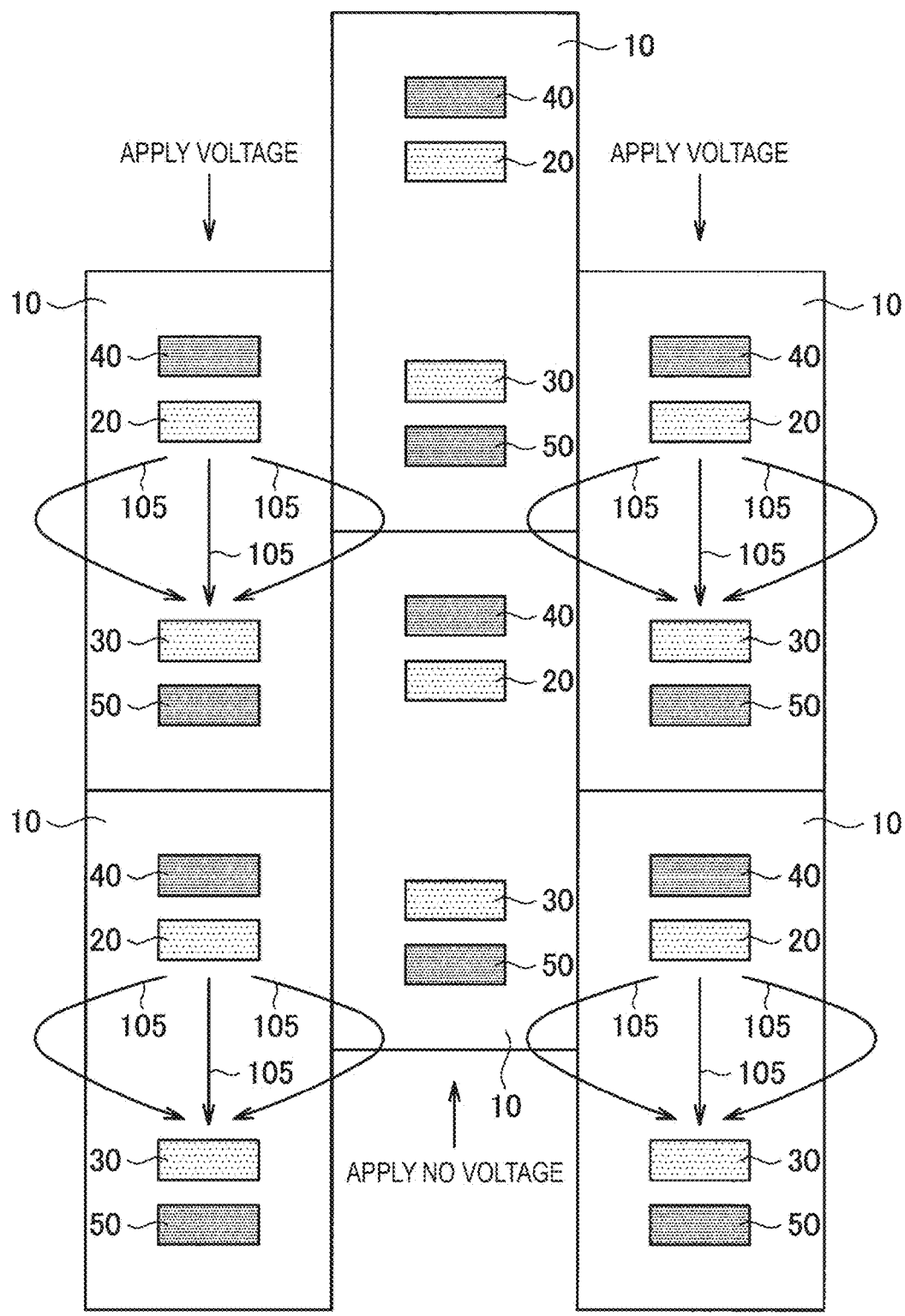
FIG. 6C is a plan view illustrating a variation of the arrangement of pixels.

FIGS. 6A to 6C are plan views each of which illustrates a variation of the arrangement of pixels. FIG. 6A illustrates the arrangement in which the arrangement of adjacent pixels is shifted by a half pixel in the vertical direction of the figure. According to the arrangement illustrated in FIG. 6A, it is possible to increase the area of regions capable of contributing to the collection of electric charges when the electric fields 105 are produced. In addition, according to the configuration illustrated in FIG. 6A, the electric fields 105 of adjacent pixels are spaced apart from each other, so that it is possible to suppress the generation of crosstalk. In this case, the pixels may also be vertically long, square, or horizontally long.

FIG. 6B is a schematic diagram illustrating an example in which pixels are arranged in a grid. According to the configuration illustrated in FIG. 6B, the electric fields 105 of any pixel repel the electric fields 105 of an adjacent pixel, and the electric fields do not expand around. Accordingly, it is not possible to enlarge the area of the regions capable of contributing to the collection of electric charges. Thus, it is possible to enlarge regions capable of contributing to the collection of electric charges in the arrangement illustrated in FIG. 6A rather than the arrangement illustrated in FIG. 6B.

FIG. 6C is a schematic diagram illustrating the case where pixel combination is performed in the arrangement example of FIG. 6A. As illustrated in FIG. 6C, applying voltage every other row from the p-type diffusion layers 20 and the p-type diffusion layers 30 makes it possible to perform pixel combination.

Figure 7:
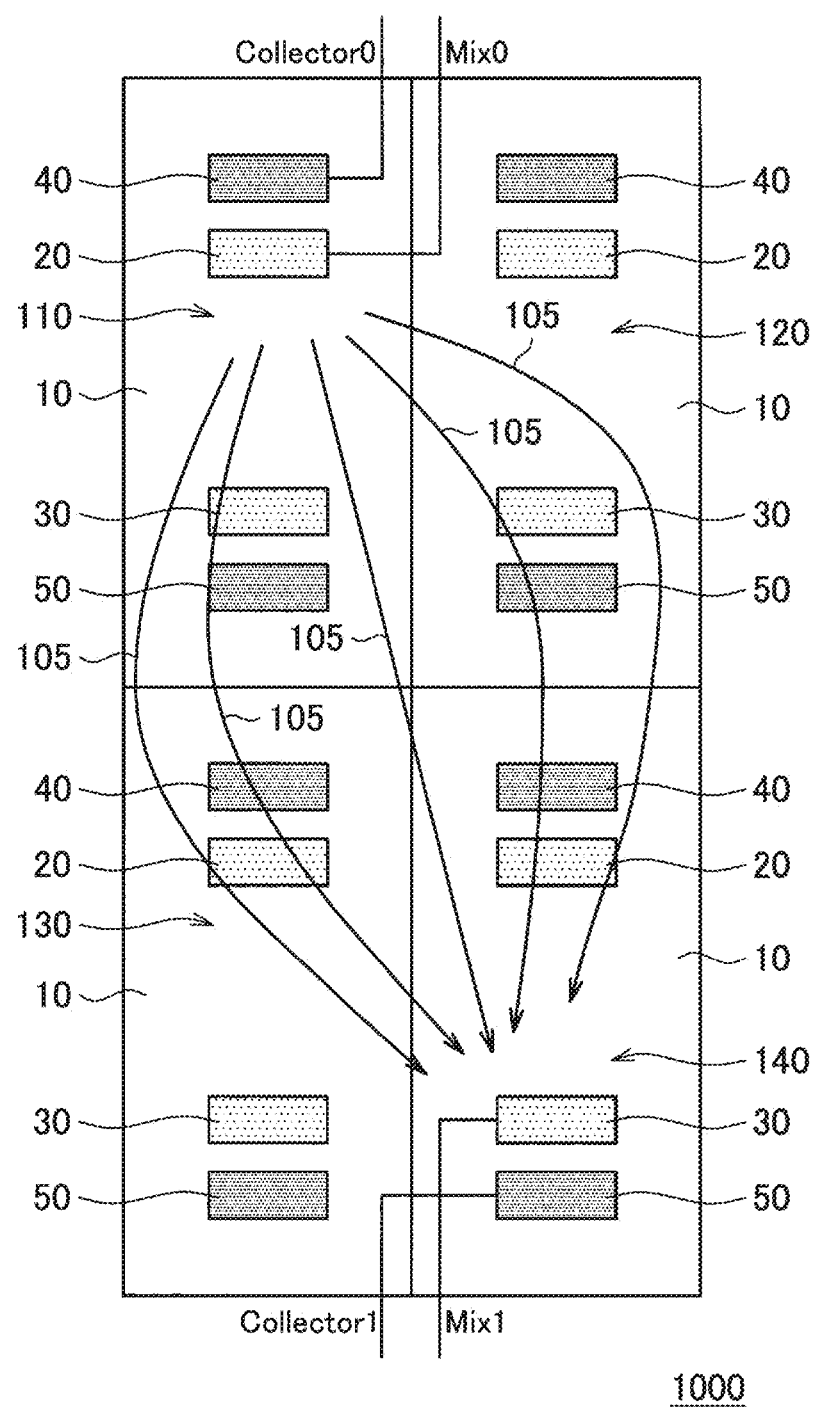
FIG. 7 is a schematic diagram illustrating an example in which pixel combination is performed on a region (2×2-pixel region) that includes two pixels in a vertical direction and two pixels in a horizontal direction.

FIG. 5 illustrates an example in which pixel combination is performed on the regions (1×2-pixel region) including one pixel in the vertical direction and two pixels in the horizontal direction, but it is also possible to combine pixel regions including any plurality of pixels. FIG. 7 is a schematic diagram illustrating an example in which pixel combination is performed on a region (2×2-pixel region) that includes two pixels in the vertical direction and two pixels in the horizontal direction. In this case, voltage is applied between a p-type diffusion layer 20b of the pixel 110 and the p-type diffusion layer 30b of the pixel 140 illustrated in FIG. 7 to produce the electric fields 105. This makes it possible to perform pixel combination on the regions of four pixels which include two pixels in the vertical direction and two pixels in the horizontal direction.

3. Regarding Driving of Pixel

Figure 8:
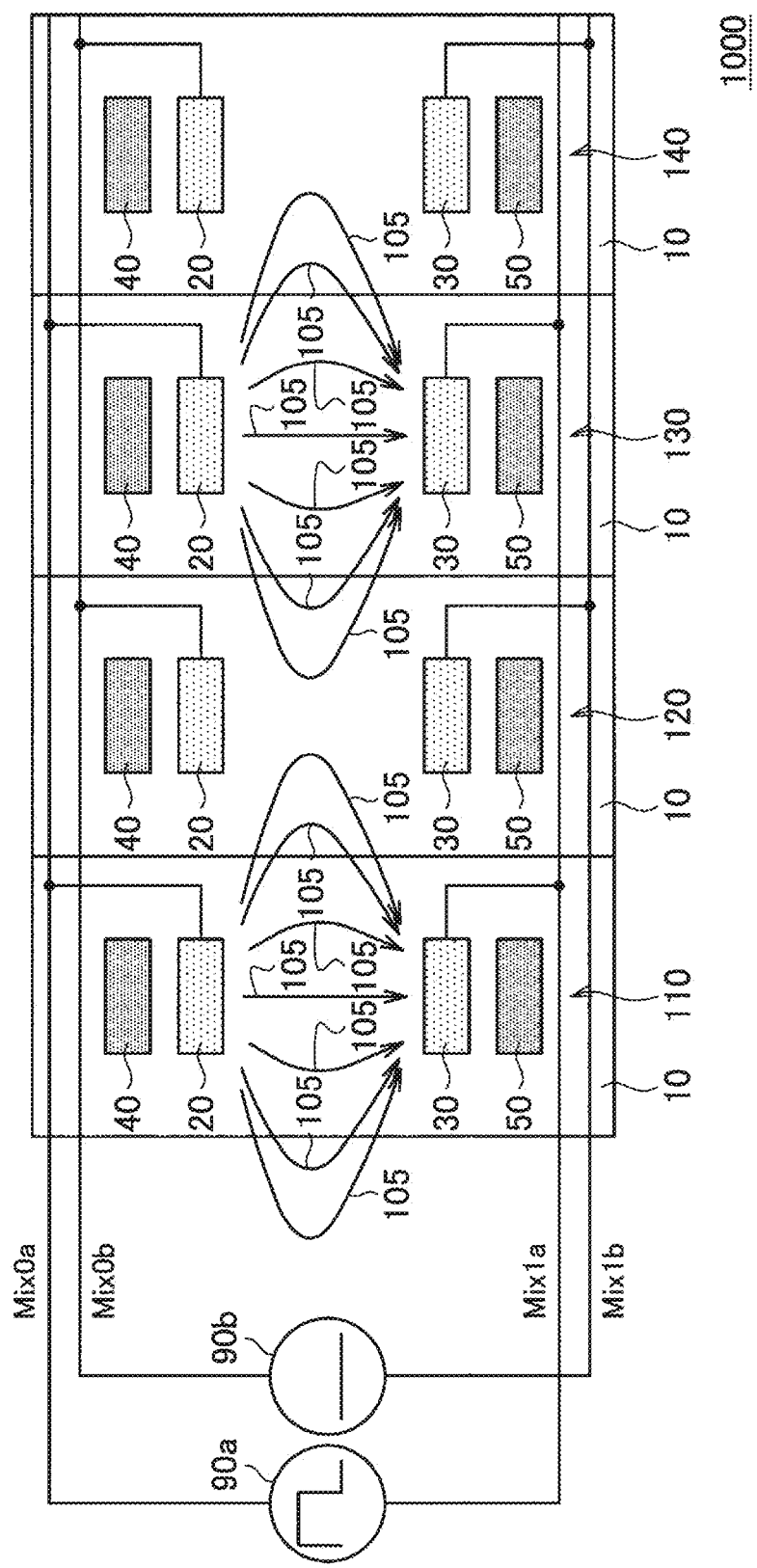
FIG. 8 is a schematic diagram for describing driving of a pixel.

FIG. 8 is a schematic diagram for describing the driving of a pixel. At the time of pixel combination, pixels are produced that are driven by applying voltage to the p-type diffusion layers 20 and 30, and pixels are produced that are not driven with no voltage applied to the p-type diffusion layers 20 and 30. Therefore, the ToF sensor 1000 is configured to divide a drive line into a plurality of drive lines. As illustrated in FIG. 8, a power supply 90a is connected to the p-type diffusion layers 20 and the p-type diffusion layers 30 of the pixels 110 and 130. Meanwhile, a power supply 90b is connected to the p-type diffusion layers 20 and the p-type diffusion layers 30 of the pixels 120 and 140. At the time of pixel combination, the power supply 90a is driven to apply the voltage V1 to electrodes Mix0a and Mix1a respectively connected to the p-type diffusion layers 20 and 30 of the pixels 110 and 130. Meanwhile, the power supply 90b is not driven, thereby applying no voltage V to electrodes Mix0b and Mix1b respectively connected to the p-type diffusion layers 20 and 30 of the pixels 110 and 130. This produces the electric fields 105 between the p-type diffusion layer 20 and the p-type diffusion layer 30 of the pixel 110, and produces the electric fields 105 between the p-type diffusion layer 20 and the p-type diffusion layer 30 of the pixel 130, so that the pixels are combined similarly to FIG. 4.

In addition, in the case where pixel combination is not performed in FIG. 8, the power supply 90a is driven to apply the voltage V1 to the electrodes Mix0a and Mix1a, and the power supply 90b is also driven to apply the voltage V1 to the electrodes Mix0b and Mix1b. In this way, at the time of driving all the pixels when pixel combination is not performed, providing the same driving signals to all the pixels makes it possible to drive all the pixels.

As described above, at the time of pixel combination, the electrodes Mix0a and Mix1a, which are driven, are distinguished from the electrodes Mix0b and Mix1b, which are not driven, thereby making it possible to set pixels that are driven by applying voltage and pixels that are not driven with no voltage applied.

Figure 9:
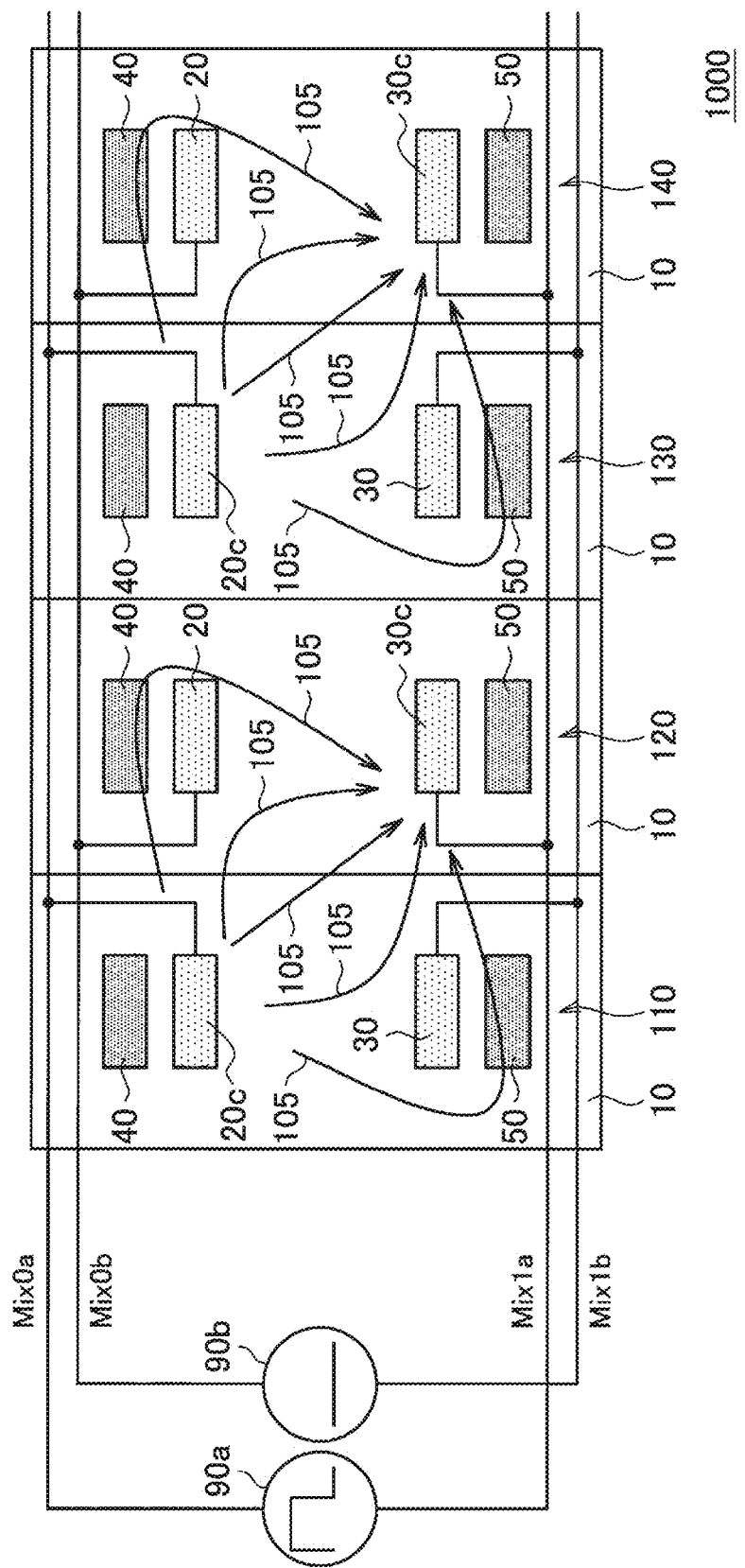
FIG. 9 is a schematic diagram for describing the driving of a pixel, and illustrates a configuration of a case where electrodes diagonally positioned in two adjacent pixels are driven.

FIG. 9 is a schematic diagram for describing the driving of a pixel, and illustrates the configuration of the case where electrodes diagonally positioned in two adjacent pixels are driven. As illustrated in FIG. 9, the electrode Mix0a of the power supply 90a is connected to respective p-type diffusion layers 20c of the pixel 110 and the pixel 130. In addition, an electrode Mix1a of the power supply 90a is connected to respective p-type diffusion layers 30c of the pixels 120 and 140. In addition, the electrode Mix0b of the power supply 90b is connected to the respective p-type diffusion layers 20 of the pixel 120 and the pixel 140, and the electrode Mix1b of the power supply 90b is connected to the respective p-type diffusion layers 30 of the pixel 110 and the pixel 130. At the time of pixel combination, the power supply 90a is driven to apply the voltage V1 to the electrode Mix0a connected to the pixels 110 and 130 and the electrode Mix1a connected to the pixels 120 and 140. In addition, at the time of pixel combination, the power supply 90b is not driven, thereby applying no voltage V1 to the electrode Mix0b connected to the pixels 120 and 140 and the electrode Mix1b connected to the pixels 110 and 130. Thus, at the time of pixel combination, as illustrated in FIG. 9, the voltage V1 is applied between the p-type diffusion layer 20c of the pixel 110 and the p-type diffusion layer 30c of the pixel 120, and the voltage V1 is applied between the p-type diffusion layer 20c of the pixel 130 and the p-type diffusion layer 30c of the pixel 140. Accordingly, it is possible to produce the electric fields 105 in an oblique direction in the two of the adjacent pixels 110 and 120, and produce the electric fields 105 in the oblique direction in the two of the adjacent pixels 130 and 140.

In addition, in the case where pixel combination is not performed in FIG. 9, the power supply 90a and the power supply 90b are both driven to apply the voltage V1 to the electrode Mix0a and the electrode Mix1a and also apply the voltage V1 to the electrode Mix1b. In this way, at the time of driving all the pixels when pixel combination is not performed, providing the same driving signals to all the pixels makes it possible to drive all the pixels.

Figure 10:
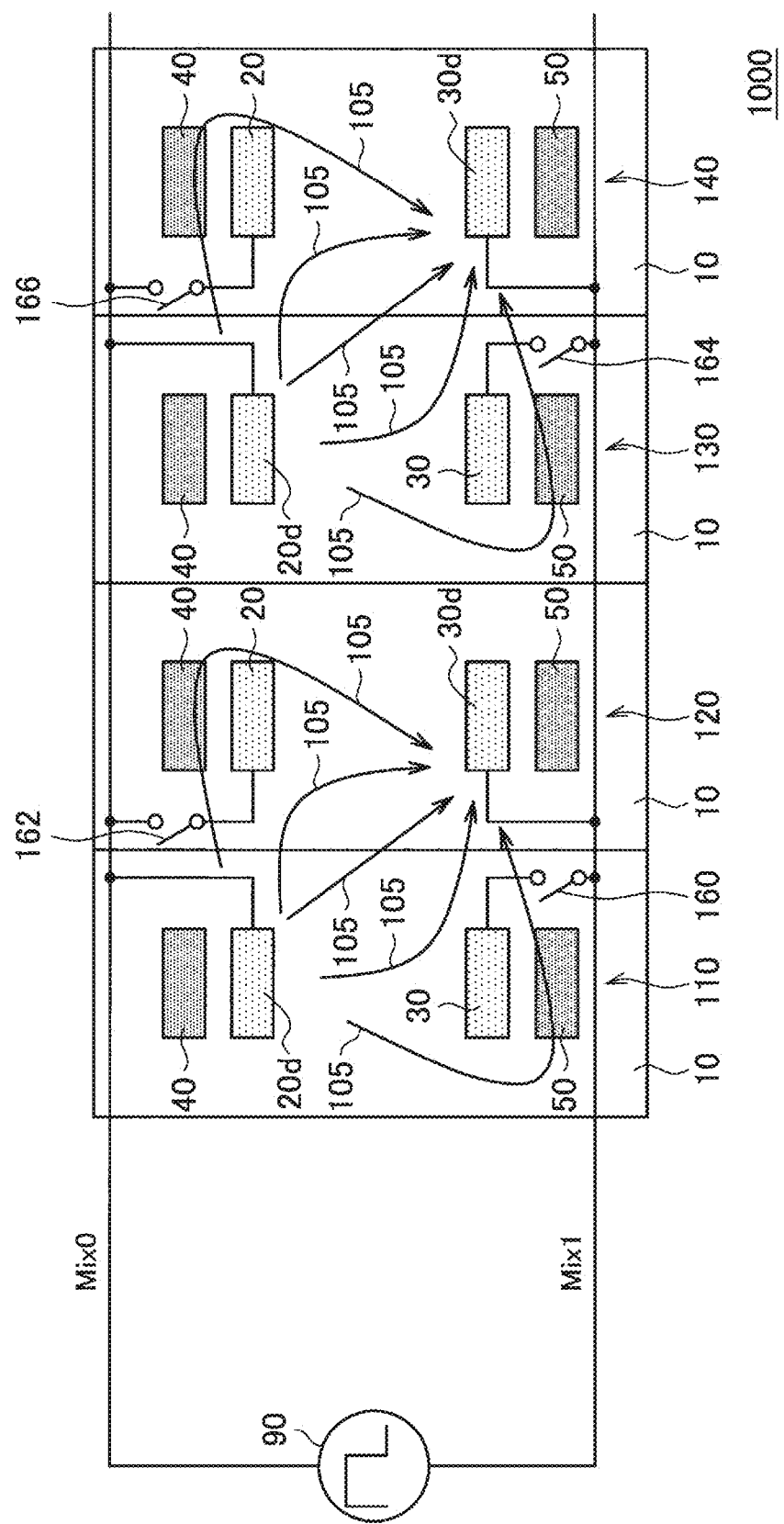
FIG. 10 is a schematic diagram illustrating an example in which a switch is provided to produce an electric field pixel in an oblique direction like FIG. 9 when pixel combination is performed.

FIG. 10 is a schematic diagram illustrating an example in which switches 160, 162, 164, and 166 are provided to connect the electrode Mix0 to the p-type diffusion layers 20 of the pixel 110, the pixel 120, the pixel 130 and the pixel 140, connect the electrode Mix1 to the p-type diffusion layers 30 of the pixel 110, the pixel 120, the pixel 130 and the pixel 140, and produce the electric fields 105 in the oblique direction, which are similar to those of FIG. 9, at the time of pixel combination. In the case where pixel combination is performed, as illustrated in FIG. 10, the switches 160, 162, 164, and 166 are turned off and the power supply 90 is driven to apply the voltage V1 to a p-type diffusion layer 20d of the pixel 110, a p-type diffusion layer 30d of the pixel 120, the p-type diffusion layer 20d of the pixel 130, and the p-type diffusion layer 30d of a pixel 140d. In addition, in the case where pixel combination is not performed, all the switches 160, 162, 164, and 166 are turned on and the voltage V1 is applied from the power supply 90 to the p-type diffusion layers 20 and the p-type diffusion layers 30 of all the pixels to drive all the pixel 110, the pixel 120, the pixel 130, and the pixel 140. Note that the switches 160, 162, 164, and 166 can be implemented, for example, by field effect transistors (MOSFET) or the like.

Figure 11:
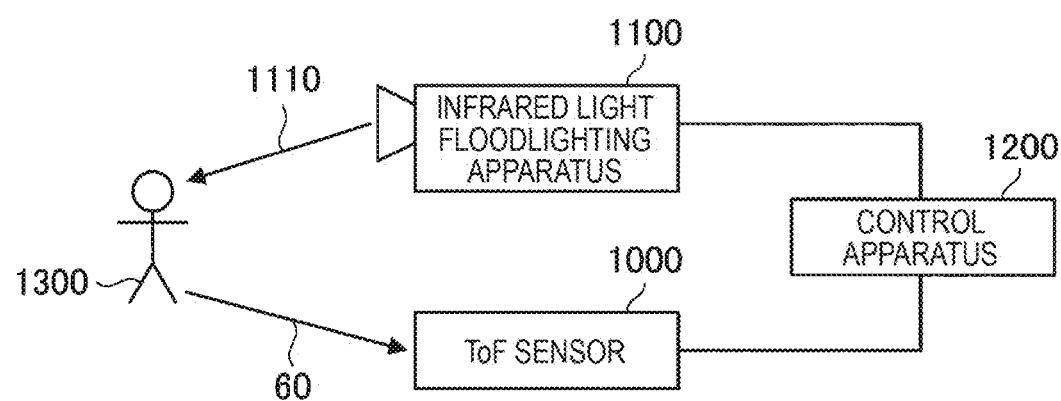
FIG. 11 is a schematic diagram illustrating a configuration of a distance measurement system including an imaging apparatus according to the present embodiment.

4. Configuration Example of Distance Measurement System According to Present Embodiment FIG. 11 is a schematic diagram illustrating the configuration of a distance measurement system 2000 including the ToF sensor 1000 that is an imaging apparatus according to the present embodiment. As illustrated in FIG. 11, the distance measurement system 2000 includes the ToF sensor 1000, an infrared light floodlighting apparatus 1100 that floodlights the target 1300 with infrared light, and a control apparatus 2000 that controls the ToF sensor 1000 and the infrared light floodlighting apparatus 1100. The infrared light floodlighting apparatus 1100 floodlights the target 1300 with infrared light 1110, and the light 60 reflected by the target 1300 is incident on the ToF sensor 1000, thereby detecting the light 60. A control apparatus 1200 synchronizes the infrared light floodlighting apparatus 1100 with the imaging apparatus 1000, and acquires the time at which the infrared light floodlighting apparatus 1100 casts the infrared light 1110 and the time at which the ToF sensor 1000 receives the light 60. The control apparatus 1200 then measures the distance to the target 130 on the basis of the period of time (time of flight) from the time at which the infrared light 1110 is cast to the time at which the ToF sensor 1000 receives the light 60.

5. Application Examples

The technology according to the present disclosure is applicable to a variety of products. For example, the technology according to the present disclosure is implemented as apparatuses mounted on any type of mobile objects such as automobiles, electric vehicles, hybrid electric vehicles, motorcycles, bicycles, personal mobilities, airplanes, drones, ships, robots, construction machines, and agricultural machines (tractors).

Figure 12:
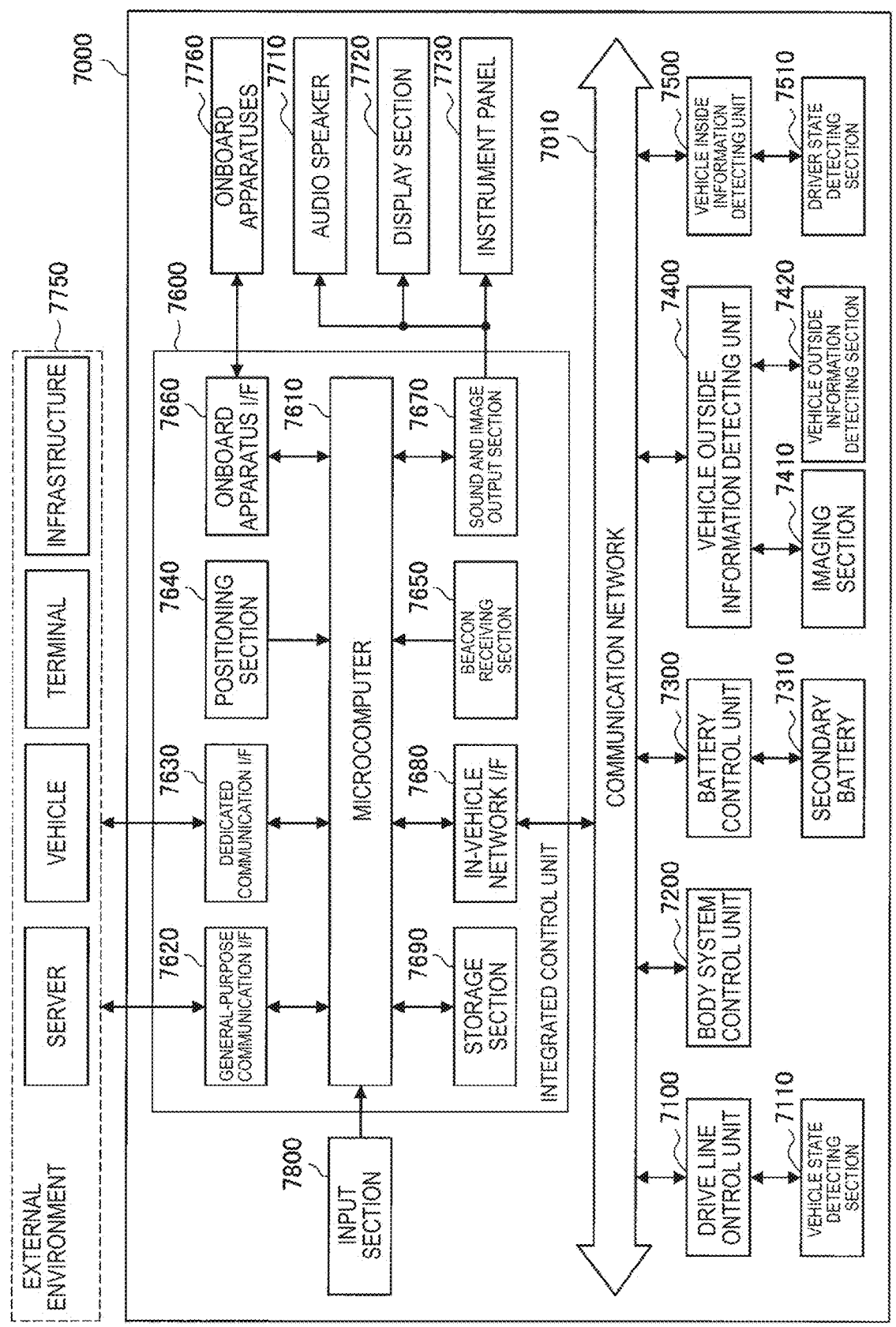
FIG. 12 is a block diagram illustrating a schematic configuration example of a vehicle control system that is an example of a mobile object control system to which the technology according to the present disclosure can be applied.

FIG. 12 is a block diagram illustrating a schematic configuration example of a vehicle control system 7000 that is an example of a mobile object control system to which the technology according to the present disclosure can be applied. The vehicle control system 7000 includes a plurality of electronic control units connected via a communication network 7010. In the example illustrated in FIG. 12, the vehicle control system 7000 includes a drive line control unit 7100, a body system control unit 7200, a battery control unit 7300, a vehicle outside information detecting unit 7400, a vehicle inside information detecting unit 7500, and an integrated control unit 7600. The communication network 7010, which connects the plurality of these control units, may be an in-vehicle communication network such as a controller area network (CAN), a local interconnect network (LIN), a local area network (LAN), or FlexRay (registered trademark) that is compliant with any standard.

Each control unit includes a microcomputer that performs operation processing in accordance with a variety of programs, a storage section that stores the programs, parameters used for the variety of operations, or the like executed by the microcomputer, and a driving circuit that drives apparatuses subjected to various types of control. Each control unit includes a network I/F used to communicate with the other control units via the communication network 7010, and a communication I/F used to communicate with apparatuses, sensors, or the like outside and inside the vehicle through wired communication or wireless communication. FIG. 12 illustrates a microcomputer 7610, a general-purpose communication I/F 7620, a dedicated communication I/F 7630, a positioning section 7640, a beacon receiving section 7650, an onboard apparatus I/F 7660, a sound and image output section 7670, an in-vehicle network I/F 7680, and a storage section 7690 as functional components of the integrated control unit 7600. Each of the other control units similarly includes a microcomputer, a communication I/F, a storage section, and the like.

The drive line control unit 7100 controls the operation of apparatus related to the drive line of the vehicle in accordance with a variety of programs. For example, the drive line control unit 7100 functions as a control apparatus for a driving force generating apparatus such as an internal combustion engine or a driving motor that generates the driving force of the vehicle, a driving force transferring mechanism that transfers the driving force to wheels, a steering mechanism that adjusts the steering angle of the vehicle, a braking apparatus that generates the braking force of the vehicle, and the like. The drive line control unit 7100 may have the function of a control apparatus for an antilock brake system (ABS) or an electronic stability control (ESC).

The drive line control unit 7100 is connected to a vehicle state detecting section 7110. The vehicle state detecting section 7110 includes, for example, at least one of sensors such as a gyro sensor that detects the angular velocity of the axial rotating motion of the vehicle body, an acceleration sensor that detects the acceleration of the vehicle, or a sensor that detects the operation amount of the accelerator pedal, the operation amount of the brake pedal, the steering wheel angle of the steering wheel, the engine speed, the wheel rotation speed, or the like. The drive line control unit 7100 uses a signal input from the vehicle state detecting section 7110 to perform operation processing, and controls the internal combustion engine, the driving motors, the electric power steering apparatus, the braking apparatus, or the like.

The body system control unit 7200 controls the operations of a variety of apparatuses attached to the vehicle body in accordance with a variety of programs. For example, the body system control unit 7200 functions as a control apparatus for a keyless entry system, a smart key system, a power window apparatus, or a variety of lights such as a headlight, a backup light, a brake light, a blinker, or a fog lamp. In this case, the body system control unit 7200 can receive radio waves transmitted from a portable apparatus that serves instead of the key or signals of a variety of switches. The body system control unit 7200 receives these radio waves or signals, and controls the vehicle door lock apparatus, the power window apparatus, the lights, or the like.

The battery control unit 7300 controls a secondary battery 7310 in accordance with a variety of programs. The secondary battery 7310 serves as a power supply source of a driving motor. For example, the battery control unit 7300 receives information such as the battery temperature, the battery output voltage, or the remaining battery capacity from a battery apparatus including the secondary battery 7310. The battery control unit 7300 uses these signals to perform operation processing, and performs temperature adjusting control on the secondary battery 7310 or controls a cooling apparatus or the like included in the battery apparatus.

The vehicle outside information detecting unit 7400 detects information regarding the outside of the vehicle including the vehicle control system 7000. For example, the vehicle outside information detecting unit 7400 is connected to at least one of an imaging section 7410 and a vehicle outside information detecting section 7420. The imaging section 7410 includes at least one of a time of flight (ToF) camera, a stereo camera, a monocular camera, an infrared camera, and other cameras. The vehicle outside information detecting section 7420 includes, for example, at least one of an environment sensor that detects the current weather, and a surrounding information detecting sensor that detects another vehicle, an obstacle, a pedestrian, or the like around the vehicle including the vehicle control system 7000.

The environment sensor may be, for example, at least one of a raindrop sensor that detects rainy weather, a fog sensor that detects a fog, a sunshine sensor that detects the degree of sunshine, a snow sensor that detects a snowfall. The surrounding information detecting sensor may be at least one of an ultrasonic sensor, a radar apparatus, and a light detection and ranging/laser imaging detection and ranging (LIDAR) apparatus. These imaging section 7410 and vehicle outside information detecting section 7420 may be installed as independent sensors or apparatuses, or as an apparatus into which sensors and apparatuses are integrated.

Figure 13:
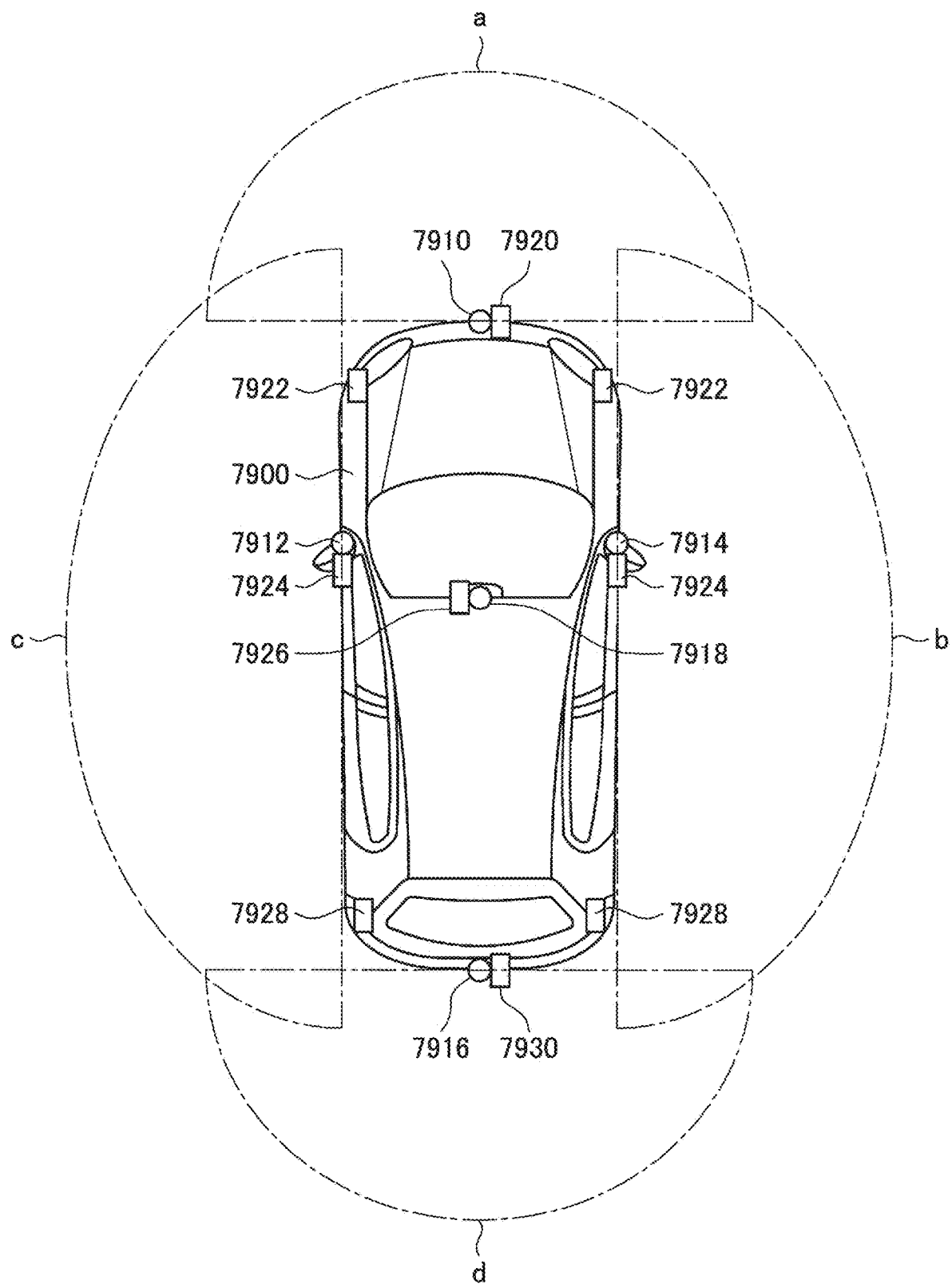
FIG. 13 is a schematic diagram illustrating an example of installation positions of an imaging section and a vehicle outside information detecting section.

Here, FIG. 13 illustrates an example of the installation positions of the imaging section 7410 and the vehicle outside information detecting section 7420. Imaging sections 7910, 7912, 7914, 7916, and 7918 are positioned, for example, at at least one of the front nose, a side mirror, the rear bumper, the back door, and the upper part of the windshield in the vehicle compartment of a vehicle 7900. The imaging section 7910 attached to the front nose and the imaging section 7918 attached to the upper part of the windshield in the vehicle compartment chiefly acquire images of the area ahead of the vehicle 7900. The imaging sections 7912 and 7914 attached to the side mirrors chiefly acquire images of the areas on the sides of the vehicle 7900. The imaging section 7916 attached to the rear bumper or the back door chiefly acquires images of the area behind the vehicle 7900. The imaging section 7918 attached to the upper part of the windshield in the vehicle compartment is used chiefly to detect a preceding vehicle, a pedestrian, an obstacle, a traffic light, a traffic sign, a lane, or the like.

Note that FIG. 13 illustrates an example of the respective imaging ranges of the imaging sections 7910, 7912, 7914, and 7916. An imaging range a represents the imaging range of the imaging section 7910 attached to the front nose. Imaging ranges b and c respectively represent the imaging ranges of the imaging sections 7912 and 7914 attached to the side mirrors. An imaging range d represents the imaging range of the imaging section 7916 attached to the rear bumper or the back door. For example, overlaying image data captured by the imaging sections 7910, 7912, 7914, and 7916 offers an overhead image that looks down on the vehicle 7900.

Vehicle outside information detecting sections 7920, 7922, 7924, 7926, 7928, and 7930 attached to the front, the rear, the sides, the corners, and the upper part of the windshield in the vehicle compartment of the vehicle 7900 may be, for example, ultrasonic sensors or radar apparatuses. The vehicle outside information detecting sections 7920, 7926, and 7930 attached to the front nose, the rear bumper, the back door, and the upper part of the windshield in the vehicle compartment of the vehicle 7900 may be, for example, LIDAR apparatuses. These vehicle outside information detecting sections 7920 to 7930 are used chiefly to detect a preceding vehicle, a pedestrian, an obstacle, or the like.

The description will continue with reference to FIG. 12 again. The vehicle outside information detecting unit 7400 causes the imaging section 7410 to capture images of the outside of the vehicle, and receives the captured image data. In addition, the vehicle outside information detecting unit 7400 receives detection information from the connected vehicle outside information detecting section 7420. In the case where the vehicle outside information detecting section 7420 is an ultrasonic sensor, a radar apparatus, or a LIDAR apparatus, the vehicle outside information detecting unit 7400 causes ultrasound, radio waves, or the like to be transmitted, and receives the information of the received reflected waves. The vehicle outside information detecting unit 7400 may perform processing of detecting an object such as a person, a car, an obstacle, a traffic sign, or a letter on a road, or a process of detecting the distance on the basis of the received information. The vehicle outside information detecting unit 7400 may perform environment recognition processing of recognizing a rainfall, a fog, a road condition, or the like on the basis of the received information. The vehicle outside information detecting unit 7400 may compute the distance to an object outside the vehicle on the basis of the received information.

Further, the vehicle outside information detecting unit 7400 may perform image recognition processing of recognizing a person, a car, an obstacle, a traffic sign, a letter on a road, or the like, or processing of detecting the distance on the basis of the received image data. The vehicle outside information detecting unit 7400 may perform distortion correcting processing, positioning processing, or the like on the received image data, and combine image data captured by a different imaging section 7410 to generate an overhead view or a panoramic image. The vehicle outside information detecting unit 7400 may use the image data captured by the other imaging section 7410 to perform viewpoint converting processing.

The vehicle inside information detecting unit 7500 detects information regarding the inside of the vehicle. The vehicle inside information detecting unit 7500 is connected, for example, to a driver state detecting section 7510 that detects the state of the driver. The driver state detecting section 7510 may include a camera that images the driver, a biological sensor that detects biological information of the driver, a microphone that picks up a sound in the vehicle compartment, or the like. The biological sensor is attached, for example, to a seating face, the steering wheel, or the like, and detects biological information of the passenger sitting on the seat or the driver gripping the steering wheel. The vehicle inside information detecting unit 7500 may compute the degree of the driver's tiredness or the degree of the driver's concentration or determine whether the driver have a doze, on the basis of detection information input from the driver state detecting section 7510. The vehicle inside information detecting unit 7500 may perform processing such as noise cancelling processing on the picked-up sound signal.

The integrated control unit 7600 controls the overall operation inside the vehicle control system 7000 in accordance with a variety of programs. The integrated control unit 7600 is connected to an input section 7800. The input section 7800 is implemented as an apparatus, for example, a touch panel, a button, a microphone, a switch, a lever, or the like on which a passenger can perform an input operation. The integrated control unit 7600 may receive data obtained by recognizing the voice input through the microphone. The input section 7800 may be, for example, a remote control apparatus that uses infrared light or other radio waves, or an external connection apparatus such as a mobile telephone or a personal digital assistant (PDA) corresponding to the operation of the vehicle control system 7000. The input section 7800 may be, for example, a camera. In that case, a passenger can input information through gesture. Alternatively, data may be input that is obtained by detecting the movement of a wearable apparatus worn by a passenger. Moreover, the input section 7800 may include an input control circuit or the like that generates an input signal, for example, on the basis of information input by a passenger or the like using the above-described input section 7800, and outputs the generated input signal to the integrated control unit 7600. The passenger or the like operates this input section 7800, thereby inputting various types of data to the vehicle control system 7000 or instructing the vehicle control system 7000 about a processing operation.

The storage section 7690 may include a read only memory (ROM) that stores a variety of programs to be executed by a microcomputer, and a random access memory (RAM) that stores a variety of parameters, operation results, sensor values, or the like. In addition, the storage section 7690 may be implemented by a magnetic storage device such as a hard disk drive (HDD), a semiconductor storage device, an optical storage device, a magneto-optical storage device, or the like.

The general-purpose communication I/F 7620 is a general-purpose communication I/F that mediates in communication between a variety of apparatuses in an external environment 7750. The general-purpose communication I/F 7620 may implement a cellular communication protocol such as Global System of Mobile communications (GSM (registered trademark)), WiMAX, Long Term Evolution (LTE) or LTE-Advanced (LTE-A), or other wireless communication protocols such as a wireless LAN (which is also referred to as Wi-Fi (registered trademark)) or Bluetooth (registered trademark). The general-purpose communication I/F 7620 may be connected to an apparatus (such as an application server or a control server) on an external network (such as the Internet, a cloud network, or a network specific to a service provider), for example, via a base station or an access point. In addition, the general-purpose communication I/F 7620 may be connected to a terminal (such as a terminal of the driver, a pedestrian or a store, or a machine type communication (MTC) terminal) in the vicinity of the vehicle, for example, using the peer-to-peer (P2P) technology.

The dedicated communication I/F 7630 is a communication I/F that supports a communication protocol defined for the purpose of use for vehicles. The dedicated communication I/F 7630 may implement a standard protocol, for example, wireless access in vehicle environment (WAVE), which is a combination of IEEE 802.11p for the lower layer and IEEE 1609 for the upper layer, dedicated short range communications (DSRC), or a cellular communication protocol. The dedicated communication I/F 7630 typically performs V2X communication. The V2X communication is a concept including one or more of vehicle-to-vehicle communication, vehicle-to-infrastructure communication, vehicle-to-home communication, and vehicle-to-pedestrian communication.

The positioning section 7640 receives, for example, global navigation satellite system (GNSS) signals (such as global positioning system (GPS) signals from a GPS satellite) from a GNSS satellite for positioning, and generates position information including the latitude, longitude, and altitude of the vehicle. Note that the positioning section 7640 may also identify the present position by exchanging signals with a wireless access point, or acquire position information from a terminal such as a mobile phone, a PHS, or a smartphone that has a positioning function.

The beacon receiving section 7650 receives radio waves or electromagnetic waves, for example, from a wireless station or the like installed on the road, and acquires information such as the present position, traffic congestion, closed roads, or necessary time. Note that the function of the beacon receiving section 7650 may be included in the above-described dedicated communication I/F 7630.

The onboard apparatus I/F 7660 is a communication interface that mediates in connections between the microcomputer 7610 and a variety of onboard apparatuses 7760 in the vehicle. The onboard apparatus I/F 7660 may use a wireless communication protocol such as a wireless LAN, Bluetooth (registered trademark), near field communication (NFC), or a wireless USB (WUSB) to establish a wireless connection. In addition, the onboard apparatus I/F 7660 may also establish a wired connection such as a universal serial bus (USB), a high-definition multimedia interface (HDMI (registered trademark)), or a mobile high-definition link (MHL) via a connection terminal (not illustrated) (and a cable if necessary). The onboard apparatuses 7760 may include, for example, at least one of a mobile apparatus of a passenger, a wearable apparatus of a passenger, and an information apparatus carried into or attached to the vehicle. In addition, the onboard apparatuses 7760 may also include a navigation apparatus that searches for routes to any destination. The onboard apparatus I/F 7660 exchanges control signals or data signals with these onboard apparatuses 7760.

The in-vehicle network I/F 7680 is an interface that mediates in communication between the microcomputer 7610 and the communication network 7010. The in-vehicle network I/F 7680 transmits and receives signals or the like in compliance with a predetermined protocol supported by the communication network 7010.

The microcomputer 7610 of the integrated control unit 7600 controls the vehicle control system 7000 in accordance with a variety of programs on the basis of information acquired via at least one of the general-purpose communication I/F 7620, the dedicated communication I/F 7630, the positioning section 7640, the beacon receiving section 7650, the onboard apparatus I/F 7660, and the in-vehicle network I/F 7680. For example, the microcomputer 7610 may calculate a control target value of the driving force generating apparatus, the steering mechanism, or the braking apparatus on the basis of acquired information regarding the inside and outside of the vehicle, and output a control instruction to the drive line control unit 7100. For example, the microcomputer 7610 may perform cooperative control for the purpose of executing the functions of an advanced driver assistance system (ADAS) including vehicle collision avoidance or impact reduction, follow-up driving based on the inter-vehicle distance, constant vehicle speed driving, vehicle collision warning, vehicle lane departure warning, or the like. In addition, the microcomputer 7610 may control the driving force generating apparatus, the steering mechanism, the braking apparatus, or the like on the basis of acquired information regarding the areas around the vehicle, thereby performing cooperative control for the purpose of automatic driving or the like that allows the vehicle to autonomously travel irrespective of any operation of a driver.

The microcomputer 7610 may generate three-dimensional distance information regarding the distance between the vehicle and an object such as a nearby structure or person on the basis of information acquired via at least one of the general-purpose communication I/F 7620, the dedicated communication I/F 7630, the positioning section 7640, the beacon receiving section 7650, the onboard apparatus I/F 7660, and the in-vehicle network I/F 7680, and create local map information including surrounding information regarding the present position of the vehicle. Further, the microcomputer 7610 may predict danger such as vehicle collisions, approaching pedestrians or the like, or entry to closed roads on the basis of acquired information, and generate a warning signal. The warning signal may be, for example, a signal used to generate a warning sound or turn on the warning lamp.

The sound and image output section 7670 transmits an output signal of at least one of sound and images to an output apparatus capable of visually or aurally notifying a passenger of the vehicle or the outside of the vehicle of information. In the example of FIG. 12, an audio speaker 7710, a display section 7720, and an instrument panel 7730 are exemplified as the output apparatus. For example, the display section 7720 may include at least one of an onboard display and a head-up display. The display section 7720 may have an augmented reality (AR) display function. The output apparatus may also be an apparatus other than these apparatuses like a headphone, a wearable apparatus such as a glasses-type display worn by a passenger, a projector, or a lamp. In the case where the output apparatus is a display apparatus, the display apparatus visually displays a result obtained by the microcomputer 7610 performing a variety of processes or information received from another control unit in a variety of forms such as text, images, tables, or graphs. In addition, in the case where the output apparatus is a sound output apparatus, the sound output apparatus converts sound signals including reproduced sound data, acoustic data, or the like into analog signals, and aurally outputs the analog signals.

Note that, in the example illustrated in FIG. 12, at least two control units connected via the communication network 7010 may be integrated into one control unit. Alternatively, the individual control units may be configured as a plurality of control units. Moreover, the vehicle control system 7000 may also include another control unit that is not illustrated. Further, a part or the whole of the functions executed by any of the control units may be executed by another control unit in the above description. That is, as long as information is transmitted and received via the communication network 7010, predetermined operation processing may be performed by any of the control units. Similarly, a sensor or an apparatus connected to any of the control units may be connected to another control unit, and the control units may transmit and receive detection information to and from each other via the communication network 7010.

Note that the distance measurement unit 2000 according to the present embodiment is configured, for example, as the imaging section 7410 illustrated in FIG. 12. The vehicle outside information detecting unit 7400 detects the distance to the target 130 outside the vehicle, which is measured by the distance measurement unit 2000, as vehicle outside information.

In addition, the distance measurement unit 2000 according to the present embodiment is configured, for example, as the driver state detecting section 7510 illustrated in FIG. 12. The vehicle inside information detecting unit 7500 detects the distance to the target 130 inside the vehicle, which is measured by the distance measurement unit 2000, as vehicle inside information. Examples of the target 130 inside the vehicle include a driver of an automobile or the like. In this case, the vehicle inside information detecting unit 7500 is capable of detecting information of the driver.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1) An imaging apparatus including:
a pair of electric field application electrodes and a pair of electric charge extraction electrodes provided to each of a plurality of pixels; and
a voltage application section configured to apply voltage between a first electrode that is one of the pair of electric field application electrodes of a first pixel and a second electrode that is one of the pair of electric field application electrodes of a second pixel when pixel combination is performed, and produce an electric field across the first pixel and the second pixel.

(2) The imaging apparatus according to (1), in which
in each of the plurality of pixels, the pair of electric field application electrodes are disposed to be spaced apart in a first direction,
the first pixel and the second pixel are disposed adjacent to each other in a second direction orthogonal to the first direction, and
the first electrode and the second electrode are positioned in a diagonal direction of a region including the first pixel and the second pixel.

(3) The imaging apparatus according to (1), in which
the first pixel and the second pixel are included in four pixels disposed in a region including two pixels in a vertical direction and two pixels in a horizontal direction, the first pixel and the second pixel are positioned in a diagonal direction of the region of the four pixels, and
the first electrode and the second electrode are electrodes that are most distant in the diagonal direction of the region of the four pixels among the pair of electric field application electrodes included in each of the first pixel and the second pixel.

(4) The imaging apparatus according to any of (1) to (3), in which
the voltage application section applies voltage between the first electrode and the second electrode, the voltage being reversed at predetermined frequency.

(5) The imaging apparatus according to (4), including:
a second voltage application section configured to apply, in a case where pixel combination is not performed, voltage to a third electrode that is another of the pair of electric field application electrodes of the first pixel and a fourth electrode that is another of the pair of electric field application electrodes of the second pixel.

(6) The imaging apparatus according to (4), in which
the voltage application section includes
a power supply that applies, at time of driving all pixels when pixel combination is not performed, voltage between the pair of electric field application electrodes of the plurality of pixels, and
a switch that separates, when pixel combination is performed, part of a connection between the power supply and the pair of electric field application electrodes, and applies voltage between the first electrode and the second electrode.

(7) The imaging apparatus according to any of (1) to (6), in which
an electric charge excited by received light is moved with voltage applied to the pair of electric field application electrodes and extracted with voltage applied to the pair of electric charge extraction electrodes.

(8) A distance measurement system including:
a floodlight apparatus configured to floodlight a target with light;
an imaging apparatus configured to receive light reflected by the target; and
a control apparatus configured to control the floodlight apparatus and the imaging apparatus, in which
the imaging apparatus includes
a pair of electric field application electrodes and a pair of electric charge extraction electrodes provided to each of a plurality of pixels, and
a voltage application section configured to apply voltage between a first electrode that is one of the pair of electric field application electrodes of a first pixel and a second electrode that is one of the pair of electric field application electrodes of a second pixel when pixel combination is performed, and produce an electric field across the first pixel and the second pixel.

REFERENCE SIGNS LIST 20, 30 p-type diffusion layer
40, 50 n-type diffusion layer
90, 90a, 90b power supply
110, 120, 130, 140 pixel
160, 162, 164, 166 switch
1000 imaging apparatus
1100 infrared light floodlighting apparatus
1200 control apparatus
2000 distance measurement system

The invention claimed is:

1. An imaging apparatus comprising:
a pair of electric field application electrodes and a pair of electric charge extraction electrodes provided to each of a plurality of pixels; and
a voltage application section configured to apply voltage between a first electrode that is one of the pair of electric field application electrodes of a first pixel and a second electrode that is one of the pair of electric field application electrodes of a second pixel when pixel combination is performed, and produce an electric field across the first pixel and the second pixel, wherein the voltage application section is further configured to apply the voltage between the first electrode and the second electrode, the voltage being reversed at a predetermined frequency.

2. The imaging apparatus according to claim 1, wherein in each of the plurality of pixels, the pair of electric field application electrodes are disposed to be spaced apart in a first direction, the first pixel and the second pixel are disposed adjacent to each other in a second direction orthogonal to the first direction, and the first electrode and the second electrode are positioned in a diagonal direction of a region including the first pixel and the second pixel.

3. The imaging apparatus according to claim 1, wherein the first pixel and the second pixel are included in four pixels disposed in a region including two pixels in a vertical direction and two pixels in a horizontal direction, the first pixel and the second pixel are positioned in a diagonal direction of the region of the four pixels, and the first electrode and the second electrode are electrodes that are most distant in the diagonal direction of the region of the four pixels among the pair of electric field application electrodes included in each of the first pixel and the second pixel.

4. The imaging apparatus according to claim 1, comprising:

a second voltage application section configured to apply, in a case where pixel combination is not performed, voltage to a third electrode that is another of the pair of electric field application electrodes of the first pixel and a fourth electrode that is another of the pair of electric field application electrodes of the second pixel.

5. The imaging apparatus according to claim 1, wherein the voltage application section includes a power supply configured to apply, at time of driving all pixels when pixel combination is not performed, voltage between the pair of electric field application electrodes of the plurality of pixels, and a switch configured to separate, when pixel combination is performed, part of a connection between the power supply and the pair of electric field application electrodes, and applies voltage between the first electrode and the second electrode.

6. The imaging apparatus according to claim 1, wherein an electric charge excited by received light is moved with voltage applied to the pair of electric field application electrodes and extracted with voltage applied to the pair of electric charge extraction electrodes.

7. A distance measurement system comprising:

a floodlight apparatus configured to floodlight a target with light;

an imaging apparatus configured to receive light reflected by the target; and a control apparatus configured to control the floodlight apparatus and the imaging apparatus, wherein the imaging apparatus includes a pair of electric field application electrodes and a pair of electric charge extraction electrodes provided to each of a plurality of pixels, and a voltage application section configured to apply voltage between a first electrode that is one of the pair of electric field application electrodes of a first pixel and a second electrode that is one of the pair of electric field application electrodes of a second pixel when pixel combination is performed, and produce an electric field across the first pixel and the second pixel, wherein the voltage application section is further configured to apply the voltage between the first electrode and the second electrode, the voltage being reversed at a predetermined frequency.

* * * * *